US009580307B2

(12) United States Patent
Aksit et al.

(10) Patent No.: US 9,580,307 B2
(45) Date of Patent: Feb. 28, 2017

(54) SINGLE CRYSTAL MIXED METAL OXIDE NANOSHEET MATERIAL COMPOSITIONS, METHODS AND APPLICATIONS

(75) Inventors: Mahmut Aksit, Ithaca, NY (US); Richard D. Robinson, Ithaca, NY (US)

(73) Assignee: CORNELL UNIVERSITY, Ithaca, NY (US)

(*) Notice: Subject to any disclaimer, the term of this patent is extended or adjusted under 35 U.S.C. 154(b) by 193 days.

(21) Appl. No.: 14/124,302

(22) PCT Filed: Jun. 7, 2012

(86) PCT No.: PCT/US2012/041249
§ 371 (c)(1),
(2), (4) Date: Dec. 6, 2013

(87) PCT Pub. No.: WO2012/170627
PCT Pub. Date: Dec. 13, 2012

(65) Prior Publication Data
US 2014/0093778 A1  Apr. 3, 2014

Related U.S. Application Data

(60) Provisional application No. 61/495,032, filed on Jun. 9, 2011.

(51) Int. Cl.
*H01M 4/131* (2010.01)
*B82B 1/00* (2006.01)
(Continued)

(52) U.S. Cl.
CPC ............... *B82B 1/00* (2013.01); *B28B 11/00* (2013.01); *C01G 51/42* (2013.01); *C30B 29/22* (2013.01);
(Continued)

(58) Field of Classification Search
CPC ....... H01M 4/366; H01M 4/48; H01M 4/1391
See application file for complete search history.

(56) References Cited

U.S. PATENT DOCUMENTS 6,090,295 A * 7/2000 Raghavarao ........... B01D 17/04
  204/157.15
2007/0102034 A1* 5/2007 Kanno ................. C01G 51/006
  136/203

OTHER PUBLICATIONS

Saint-Paul et al. (Physica B 403 (2008) 564-568).*
(Continued)

*Primary Examiner* — Stewart Fraser
*Assistant Examiner* — Olatunji Godo
(74) *Attorney, Agent, or Firm* — Bond, Schoeneck & King, PLLC; William Greener; Alek Szecsy

(57) ABSTRACT

A nanosheet comprises a single crystal mixed metal oxide $M1_xM2_yO_2$ material composition that may comprise a single crystal $Na_xCoO_2$ material composition. The nanosheet may be prepared using a sequential process sequence that includes chelated mixed metal ion sol-gel mixture formation, autocombustion, isostatic pressing, electro kinetic demixing and calcination. This particular process sequence provides single crystal nanosheets having in-plane mutually perpendicular lateral sheet dimensions greater than about 10 microns by about 200 microns, and a thickness from about 5 to about 100 nanometers.

35 Claims, 11 Drawing Sheets

(51) Int. Cl.
- *B28B 11/00* (2006.01)
- *H01L 35/22* (2006.01)
- *H01M 4/58* (2010.01)
- *C01G 51/00* (2006.01)
- *C30B 29/22* (2006.01)
- *C30B 29/60* (2006.01)
- *H01M 4/525* (2010.01)
- *B82Y 40/00* (2011.01)
- *C30B 29/16* (2006.01)

(52) U.S. Cl.
CPC ............. *C30B 29/60* (2013.01); *C30B 29/605* (2013.01); *H01L 35/22* (2013.01); *H01M 4/525* (2013.01); *H01M 4/581* (2013.01); *B82Y 40/00* (2013.01); *C01P 2002/72* (2013.01); *C01P 2004/02* (2013.01); *C01P 2004/03* (2013.01); *C01P 2004/04* (2013.01); *C01P 2004/24* (2013.01); *C30B 29/16* (2013.01); *Y02E 60/122* (2013.01); *Y02P 70/54* (2015.11)

(56) References Cited

OTHER PUBLICATIONS

Terasaki et al. (Physical Review B Condensed Matter, Third Series, vol. 56, No. 20, Nov. 15, 1997-II).*

Nagaraj et al. (Electrophoresis 2005, 26, 10-17).*

Chang et al. (Journal of Magnetism and Magnetic Materials 310 (2007) e335-e336).*

Sun et al. (Journal of Materials Science 31 (1996) 3617-3621).*

Zhang et al. (Mater. Sci. Forum, 475-479, 3807 (2005)).*

Takahashi et al. (Journal of Solid State Chemistry 172 (2003) 22-26).*

Tanaka, T., Ebina, Y., Takada, K., Kurashima, K., and Sasaki, T., Oversized Titania Nanosheet Crystallites Derived from Flux-Grown Layered Titanate Single Crystals, Chem. Mater, vol. 15, No. 18, 2003. pp. 3564-3568.

Schaak, R. and Mallouk, T., Exfoliation of Layered Rutile and Perovskite Tungstates, Chem. Commun., 2002, pp. 706-707.

Miyamoto, N., Yamamoto, H., Kaito, R., and Kuroda, K., Formation of Extraordinarily Large Nanosheets from $K_4Nb_6O_{17}$ Crystals, Chem. Commun., 202, pp. 2378-2379.

Treacy, M.M.J., Rice, S.B., Jacobson, A.J. and Lewandowski, J.T., Electron Microscopy Study of Delamination in Dispersions of the Perovskite-Related Layered Phases $K[Ca_2Na_{n-3}Nb_nO_{3n+1}]$: Evidence for Single-Layer Formation, Chem. Mater. 1990, 2, pp. 279-286.

Miyamoto, N., and Nakato, T., Liquid Crystalline Nanosheet Colloids with Controlled Particle Size Obtained by Exfoliating Single Crystal of Layered Niobate $K_4Nb_6)17$, J. Phys. Chem. B, 2004, 108, pp. 6152-6159.

Takagaki, A., Sugisawa, M., Lu, D., Kondo, J., Hara, M., Domen, K. and Hayashi, S., Exfoliated Nanosheets as a New Strong Solid Acid Catalyst, J. Am. Chem. Soc., 2003, 125, pp. 5479-5485.

* cited by examiner

SINGLE CRYSTAL MIXED METAL OXIDE NANOSHEET MATERIAL COMPOSITIONS, METHODS AND APPLICATIONS

CROSS-REFERENCE TO RELATED APPLICATION

This application is related to, and derives priority from, U.S. Provisional Patent Application Ser. No. 61/495,032, filed 9 Jun. 2012, and titled Nanosheets, Methods and Applications, the content of which is incorporated herein fully by reference.

BACKGROUND OF THE INVENTION

Field of the Invention

Embodiments relate generally to mixed metal oxide nanosheet material compositions and methods for preparing the mixed metal oxide nanosheet material compositions. More particularly, embodiments relate to dimensionally characterized mixed metal oxide nanosheet material compositions and methods for preparing the dimensionally characterized mixed metal oxide nanosheet material compositions.

Description of the Related Art

Two-dimensional metal oxide nanosheet material compositions provide exciting opportunities for new scientific and technological breakthroughs due to their novel properties, including but not limited to electronic, ferromagnetic, magneto-optical, electrochemical, catalytic, luminous and photoresponsive properties. Although the corresponding structural, physical and chemical properties of graphene (i.e., as a nanosheet material composition) have, for comparison, been well developed and well investigated, the synthesis of free-standing two-dimensional metal oxide nanosheet material compositions is a largely unexplored area of nanoscience, especially within the context of metal oxide material compositions that include, but are not necessarily limited to, transition metal oxide material compositions.

Given the possibility of significant advances within the context of two-dimensional metal oxide nanosheet material compositions, desirable are additional two-dimensional metal oxide nanosheet material compositions and methods for fabricating the two-dimensional metal oxide nanosheet material compositions.

SUMMARY

Embodiments provide particular single crystal mixed metal oxide nanosheet material compositions having increased in-plane mutually perpendicular lateral nanosheet dimensions, and methods for preparing the particular single crystal mixed metal oxide nanosheet material compositions having the increased in-plane mutually perpendicular lateral nanosheet dimensions.

Specific embodiments of single crystal mixed metal oxide nanosheet material compositions include $Na_xCoO_2$ material compositions (where x equals 0.6 to 0.9), as well as methods for preparing the $Na_xCoO_2$ material compositions and related applications of the $Na_xCoO_2$ material compositions. The particular $Na_xCoO_2$ nanosheet material compositions in accordance with the embodiments are prepared using methods that provide the particular $Na_xCoO_2$ nanosheet material compositions with in-plane mutually perpendicular lateral (i.e., mutually perpendicular two dimensional in-plane dimensions other than thickness dimensions) nanosheet dimensions, greater than about 10 microns by about 200 microns, or more preferably greater than about 200 microns by about 350 microns. Within the context of the embodiments, the particular single crystal $Na_xCoO_2$ nanosheet material compositions have a thickness from about 5 to about 100 nanometers. The embodiments also contemplate in-plane mutually perpendicular lateral (i.e., two dimensional) nanosheet dimensions greater than about 1.8 millimeters and possibly greater than about 4.0 millimeters.

Within the context of the embodiments, "in-plane mutually perpendicular lateral sheet dimensions greater than about 10 microns by about 200 microns" or "in-plane mutually perpendicular lateral sheet dimensions greater than about 200 microns by about 350 microns" are intended to include the mutually perpendicular planar dimensions of a single crystal mixed metal oxide nanosheet material composition in accordance with the embodiments. Within the embodiments it is intended that both of the foregoing in-plane mutually perpendicular lateral sheet dimensions exceed the foregoing stated dimensional limitations. The embodiments also contemplate that an intersection point for a pair of in-plane mutually perpendicular lateral sheet dimensions in accordance with the embodiments may be positioned anywhere within a particular single crystal mixed metal oxide nanosheet material composition to provide that both of the in-plane mutually perpendicular lateral sheet dimensions exceed the foregoing stated dimensional limitations.

The particular methods for preparing the single crystal $Na_xCoO_2$ nanosheet material compositions in accordance with the embodiments provide for a chelated solution preparation of homogeneously mixed sodium, cobalt and oxygen materials which chelated sodium-cobalt-oxygen materials are pyrolized into a homogeneous mixture of sodium, cobalt and oxygen (i.e., hereinafter designated as "Na—Co—O") in a solid flake form (i.e., which serves as a precursor to the single crystal nanosheets). The flakes are of generally smaller in-plane mutually perpendicular lateral sheet dimensions, and the flakes are then anisotropically pressed into a pellet. The pellet is kinetically demixed to provide a sodium rich portion and a sodium deficient portion, and the sodium rich portion is calcined to provide the $Na_xCoO_2$ nanosheet material compositions with the lateral sheet dimensions as described above including the in-plane mutually perpendicular lateral sheet dimensions greater than about 10 microns by about 200 microns, or alternatively greater than about 200 microns by about 350 microns, and also the thickness dimension from about 5 to about 100 nanometers.

In general, it is contemplated that the embodiments may be extended to include single crystal mixed metal oxide nanosheet material compositions beyond $Na_xCoO_2$ single crystal mixed metal oxide nanosheet material compositions, where such additional single crystal mixed metal oxide nanosheet material compositions are encompassed by the general formula $M1_xM2_yO_2$, where: (1) M1 is at least one alkali metal or alkali earth metal selected from the group including but not limited to Li, Na, K, Be, Mg, Ca and Sr; (2) M2 is at least one lighter transition metal or post-transition metal selected from the group including but not limited to Ti, V, Cr, Mn, Fe, Co, Zn and Ni; and (3) x and y are independently variable. For the selection of more than one element for M1 and/or M2, sub-compositions of M1 and/or M2 can vary independently from x and/or y.

More generally, it is contemplated that the embodiments may be extended to include additional single crystal mixed metal oxide nanosheet material compositions that are encompassed by the general formula $M1_xM2_yO_2$, where: (1) M1 is at least one alkali metal or alkali earth metal; (2) M2 is at least one lighter transition or post-transition metal having an atomic number no greater than about 78; and (3) x and y are independently variable within the ranges $0.3<x<1$ and $0.9<y<1.1$.

Within the context of the embodiment, a "transition" metal is intended to be limited to selections from group 1b, group 2b, group 3b, group 4b, group 5b, group 6b, group 7b and group 8b of the Periodic Table of the Elements. Within the context of the embodiments, a "post-transition" metal is intended to be limited to metallic selections from group 3a, group 4a and group 5a of the Periodic Table of the Elements.

A particular nanosheet in accordance with the embodiments includes a single crystal mixed metal oxide $M1_xM2_yO_2$ material composition where: (1) M1 is an alkali metal or alkali earth metal; (2) M2 is a transition metal or post-transition metal having an atomic number no greater than about 78; and (3) x and y are independently variable within the ranges $0.3<x<1$ and $0.9<y<1.1$. The particular nanosheet has: (1) in-plane mutually perpendicular lateral sheet dimensions greater than about 10 microns by about 200 microns; and (2) a thickness from about 5 to about 100 nanometers.

Another particular nanosheet in accordance with the embodiments includes a single crystal $Na_xCoO_2$ material composition where $0.6<x<0.9$, and having: (1) in-plane mutually perpendicular lateral sheet dimensions greater than about 10 microns by about 200 microns; and (2) a thickness from about 5 to about 100 nanometers.

A battery electrode and a thermoelectric device are also predicated upon this other particular $Na_xCoO_2$ nanosheet material composition in accordance with the embodiments.

A particular method for preparing a nanosheet in accordance with the embodiments includes, at minimum, electro-kinetically demixing a pressed mixed metal oxide powder comprising an M1 alkali metal or alkali earth metal and an M2 transition or post-transition metal of atomic number no greater than about 78 to provide an M1 alkali metal or alkali earth metal enriched mixed metal oxide powder portion and an M1 alkali metal or alkali earth metal deficient mixed metal oxide powder portion. This particular method also includes, at minimum, calcining the M1 alkali metal or alkali earth metal enriched mixed metal oxide powder portion to provide the nanosheet comprising a single crystal mixed metal oxide $M1_xM2_yO_2$ material composition.

Another particular method for preparing a nanosheet in accordance with the embodiments includes, at minimum, electrokinetically demixing a pressed Na—Co—O powder to provide a sodium enriched Na—Co—O powder portion and a sodium deficient Na—Co—O powder portion. This other particular method also includes, at minimum, calcining the sodium enriched Na—Co—O powder portion to provide a nanosheet comprising a single crystal $Na_xCoO_2$ material composition.

BRIEF DESCRIPTION OF THE DRAWINGS

The objects, features and advantages of the embodiments are understood within the context of the Detailed Description of the Embodiments, as set forth below. The Detailed Description of the Embodiments is understood within the context of the accompanying drawings, that form a material part of this disclosure, wherein.

DETAILED DESCRIPTION OF THE EMBODIMENTS

Figure 1:
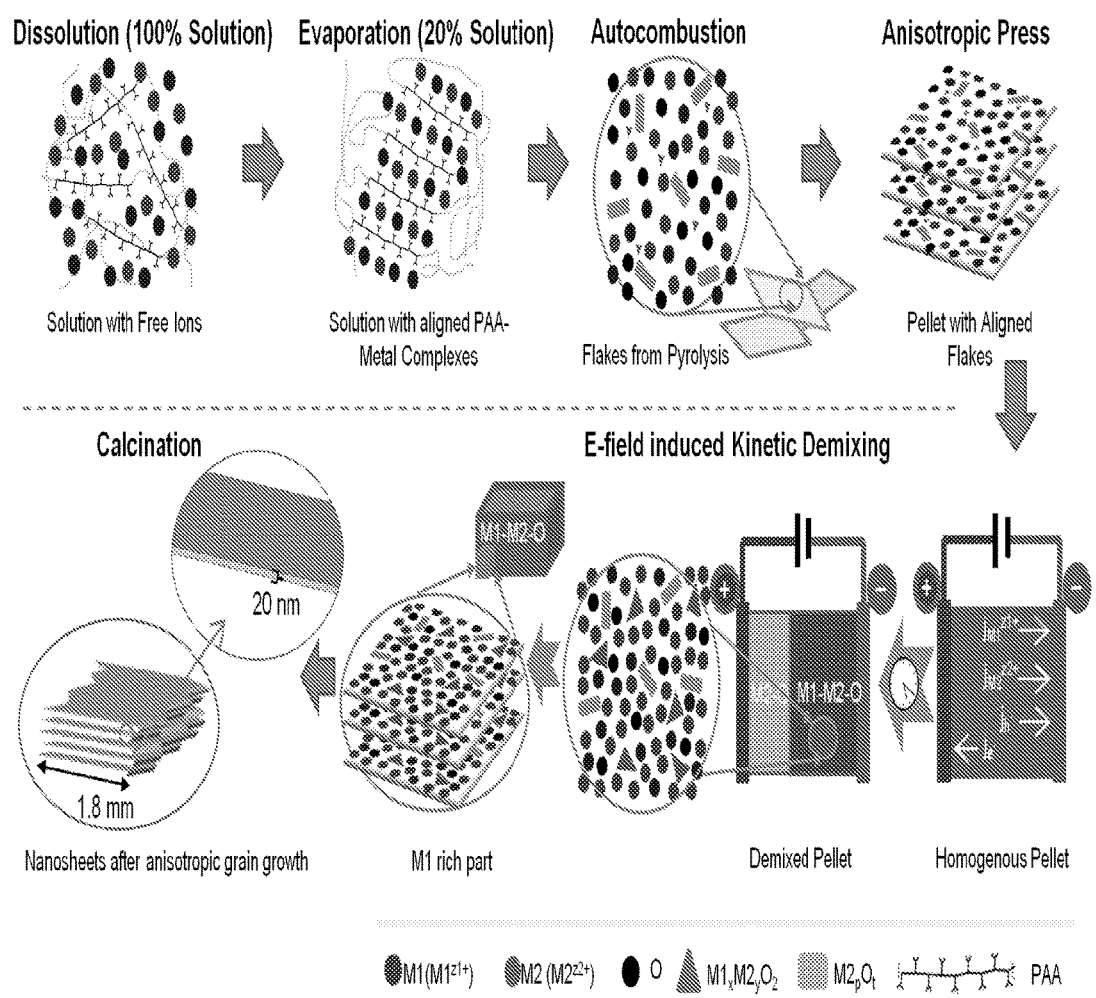
FIG. 1 shows a process flow sequence for preparing a single crystal mixed metal oxide nanosheet material composition including but not limited to a $Na_xCoO_2$ single crystal mixed metal oxide nanosheet material composition in accordance with the embodiments.
Figure 2:
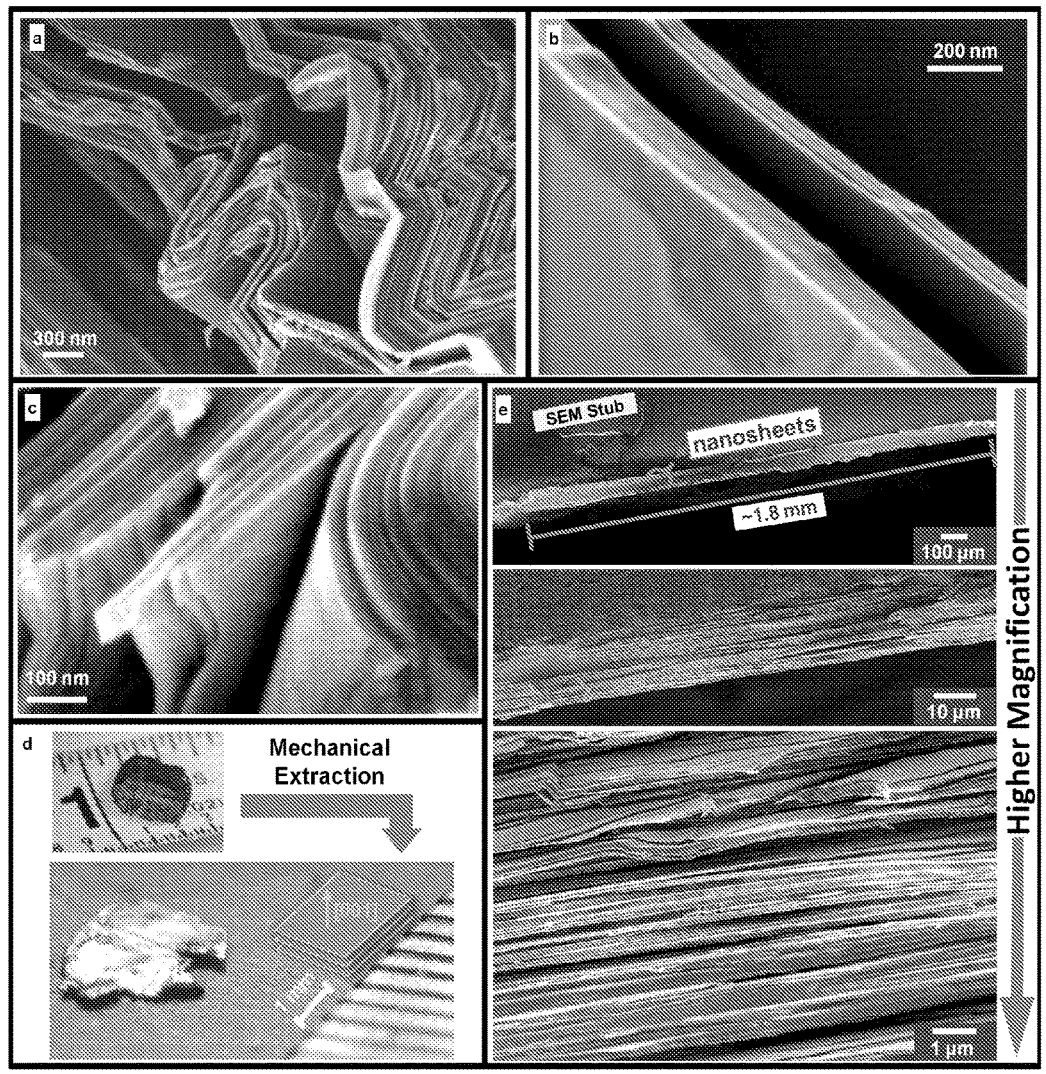
FIG. 2a, FIG. 2b, FIG. 2c and FIG. 2e show a series of scanning electron microscopy images
FIG. 2d shows optical images illustrating (with successively enhanced magnification for FIG. 2e) structural features of detached (FIG. 2b) and stacked (FIG. 2a, FIG. 2c, FIG. 2d and FIG. 2e) single crystal $Na_xCoO_2$ nanosheet material compositions in accordance with the embodiments.

Embodiments provide a single crystal mixed metal oxide nanosheet material composition and a method for preparing the single crystal mixed metal oxide nanosheet material composition. In general, the single crystal mixed metal oxide nanosheet material composition in accordance with the embodiments includes an alkali or alkali earth metal, in conjunction with a lighter transition or post-transition metal, to provide when processed in accordance with the embodiments a single crystal mixed metal oxide nanosheet material composition having enhanced in-plane mutually perpendicular lateral nanosheet dimensions. In particular with respect to materials processing considerations in accordance with the embodiments, the embodiments provide a scalable nanomanufacturing technique for batch fabrication of two dimensional single crystal mixed metal oxide nanosheet material compositions that may include, but are not necessarily limited to, the electrically conducting $Na_xCoO_2$ single crystal mixed metal oxide nanosheet material compositions.

A method in accordance with the embodiments provides a sol-gel based, bottom-up synthesis of single crystal mixed metal oxide nanosheet material compositions in accordance with the embodiments within the context of a cost-effective route that is capable of producing tens of thousands of nanosheets packed into a macro-sized pellet. It is anticipated that the particular method in accordance with the embodiments should be applicable to preparing other atomically layered single crystal mixed metal oxide nanosheet material compositions. The single crystal mixed metal oxide nanosheet material compositions prepared in accordance with the embodiments are uniform in length and shape with high aspect ratios of nanometer thickness and millimeter lateral lengths ($10^{-5}$:1:1), and are readily delaminated into free-standing nanosheet material compositions. $Na_xCoO_2$ in particular has fascinating stoichiometric-dependent properties, such as a high thermoelectric power factor, superconductivity, and candidacy as a cathode material in sodium ion batteries.

Recently $Na_xCoO_2$ has been vigorously researched due to its potential in energy harvesting and storage. $Na_xCoO_2$ is composed of two-dimensional triangular $CoO_2$ layers with $Na^+$ intercalated between the layers, occupying a variety of possible sites. The x=0.7 phase ($Na_{0.7}CoO_2$) is a surprisingly good thermoelectric material with metallic conductivity (200 μcm at 300 K), a large Seebeck Coefficient (100 μV/K at 300 K), and a thermoelectric power factor as high as the industry standard $Bi_2Te_3$. The potential of $Na_xCoO_2$ as a cathode material comes from its low electrical resistivity and high sodium mobility in the in-plane direction. Also, the hexagonal (P2) phase of $Na_xCoO_2$ (0.6<x<0.9) can efficiently accept and remove sodium ions with little change in lattice parameters, which provides for better galvanic cycling. The potential of a $Na_xCoO_2$/Na battery is 3.5 V with an energy density of up to 440 Wh/kg. Scaling $Na_xCoO_2$ to nanometer sizes will allow this important energy material to be optimized through size-dependent property engineering.

Chemical exfoliation of bulk materials has been the most common method to produce oxide nanosheets, but this aggressive top-down chemical process can damage or alter the starting compound. For instance, chemical exfoliation of thermoelectric $Na_xCoO_2$ layers yields CoO nanosheets, which are non-metallic and not useful thermoelectric materials. Since chemical exfoliation techniques delaminate layers from a bulk, they generally produce a low yield of polydisperse-shaped sheets with short lateral lengths (typically <10 μm).

I. General Process Sequence for Preparing Single Crystal Mixed Metal Oxide Nanosheet Material Compositions in Accordance with the Embodiments In accordance with disclosure below regarding $Na_xCoO_2$ nanosheet material compositions, the embodiments utilize five sequential process steps for forming single crystal mixed metal oxide nanosheet material compositions that may include, but are not limited to, the $Na_xCoO_2$ single crystal nanosheet material compositions in accordance with the embodiments. The five sequential process steps include: a) sol-gel coordination of mixed metal ions; b) pyrolysis into mixed metal oxide flakes; c) pressurized pellet formation; d) electric-field induced kinetic demixing; and e) calcination.

In general, such sol-gel coordination of mixed metal ions is undertaken with a coordinating polymer selected from the group including but not limited to poly(acrylic acid), poly(vinyl alcohol), alginate and citric acid based coordinating polymers. The sol-gel coordination of mixed metal ions may be effected in a solvent including but not limited to an aqueous solvent at a concentration range from about 1 to about 5 weight percent mixed metal ion salts.

In general, such pyrolysis of the sol-gel coordinated mixed metal ions into corresponding mixed metal oxide flakes is undertaken at a temperature from about 250 to about 550 degrees Celsius and more preferably from about 450 to about 550 degrees Celsius, for a time period from about 0.5 to about 10 minutes and more preferably from about 0.5 to about 3 minutes, to provide such mixed metal oxide flakes having perpendicular lateral dimensions from about 5 to about 400 microns.

In general, such pressurized pellet formation is undertaken at a pressure from about 200 to about 600 MPa and more preferably from about 350 to about 450 MPa and at a temperature from about 20 to about 30 degrees Celsius to provide mechanically durable rectangular pellet of mixed metal oxide flakes which are aligned perpendicular to a pressure axis.

In general, such electric field induced kinetic demixing is undertaken at an electrical field strength from about 2 to about 40 volts per centimeter and more preferably from about 5 to about 20 volts per centimeter that includes a voltage from about 5 to about 20 volts and a current up to about 0.5 amps for a time period from about 24 to about 196 hours and more preferably from about 40 to about 80 hours at a temperature from about −100 to about 800 degrees Celsius and more preferably from about 20 to about 400 degrees Celsius to provide the alkali metal or alkali earth metal rich portion to constitute a maximum portion of the rectangular pellet from about 40% to about 75% and more preferably from about 50% to about 60%.

Finally, in general, such calcining is undertaken at a temperature from about 650 to about 1300 degrees centigrade and more preferably from about 1000 to about 1050 degrees centigrade for a time period from about 30 to about 360 minutes and more preferably from about 100 to about 120 minutes, under atmospheric conditions to provide the single crystal mixed metal oxide nanosheet material composition having the in-plane mutually perpendicular lateral sheet dimensions greater than about 10 microns by about 200 microns, and preferably greater than about 200 microns by about 350 microns, and also a thickness dimension from about 5 to about 100 nanometers.

Within the context of the foregoing process parameters and limitations, a single crystal mixed metal oxide nanosheet material composition is provided having perpendicular lateral sheet dimensions greater than about 10 microns by about 200 microns, and preferably greater than about 200 microns by about 350 microns, and also a thickness dimension from about 5 to about 100 nanometers. Within the context of the embodiments, such single crystal mixed metal oxide nanosheet material compositions may have a longer lateral dimension greater than about 1.8 millimeter, and also greater than about 4 millimeters, within the context of the foregoing numerical limitations. Within the context of the embodiments, such single crystal mixed metal oxide nanosheet material compositions have a thickness from about 5 to about 100 nanometers.

Figure 3:
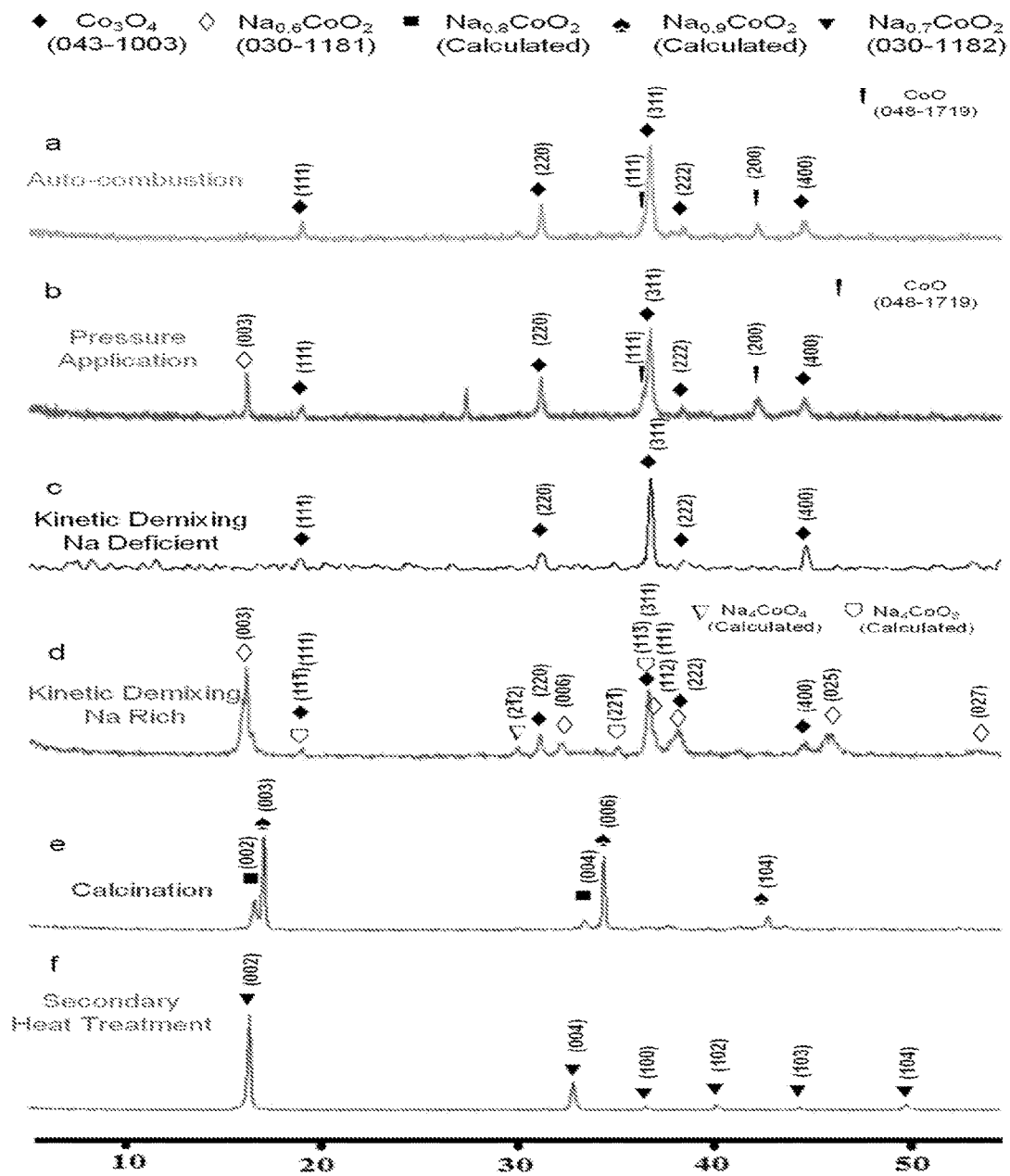
FIG. 3 shows a series of x-ray powder diffraction spectra of Na—Co—O material compositions at various stages in preparation of the single crystal $Na_xCoO_2$ nanosheet material compositions in accordance with the process flow sequence of FIG. 1.

II. Processing Sequence for Preparing Single Crystal $Na_xCoO_2$ Nanosheet Material Compositions in Accordance with the Embodiments In accordance with the general description above, the synthetic procedure for preparing single crystal $Na_xCoO_2$ nanosheet material compositions in accordance with the embodiments similarly includes: a) sol-gel coordination of sodium and cobalt metal ions; b) pyrolysis into oxide flakes; c) pressurized pellet formation; d) electric-field induced kinetic demixing; and e) calcination, as illustrated in FIG. 1. FIG. 2a, FIG. 2b, FIG. 2c and FIG. 2e show related scanning electron microscope images of the single crystal $Na_xCoO_2$ nanosheet material compositions. The embodiments provide for modification of a Pechini sol-gel synthesis to entrap the metal ions in aqueous solutions by using poly(acrylic acid), although other coordinating polymer materials may also be used. The sodium and cobalt metal cations are stabilized by the chelating groups on the poly(acrylic acid) ligand, through dipole forces between water molecules and the metal ions, and the physical tangling of the polymer chains which traps both the metal ions and a solvent in a drying polymer sheet, termed "polymeric entrapment" or "steric entrapment," as is known in the art (see, e.g., U.S. Pat. No. 6,482,387 to Gülgün et al.). The structure of these polymeric entrapped layers is evident after the solution is pyrolyzed: Scanning electron microscopy (SEM) images show that the auto-combusted flakes are ~20 nm thick and ~20 μm long. As illustrated in FIG. 3, x-ray diffraction (XRD) spectra indicates that the auto-combusted flakes contain $Co_3O_4$ crystals with a minor amount of CoO. The flakes are then packed into a rectangular die set and aligned through uniaxial pressure which encourages growth along the flake plane. While not intending to limit the embodiments, the alignment of the pressurized flakes has an influence on the kinetic-demixing: Efield induced kinetic-demixing is only possible perpendicular to a pressure axis. When an E-field is applied parallel to the pressure axis no current is observed (under identical voltage conditions as the perpendicular arrangement). This directional limitation on the E-field induced kinetic-demixing is likely a result of the lateral alignment of the auto-combusted flakes after the uniaxial pressure process; the flakes provide a more contiguous pathway for the current than a cross-plane pathway provides.

Kinetic demixing is a significant process sequence component for forming millimeter-length single crystal nanosheet material compositions. After application of a demixing electrical field at a 500 mA electrical current and 5 to 20 V electrical potential, and subsequent calcination, $Na_xCoO_2$ nanosheet lateral lengths are ~1.8 millimeters (1030° C. calcination). Samples with identical processing conditions, but without kinetic demixing reach only up to ~200 μm in length (i.e., about nine-times shorter).

Figure 4:
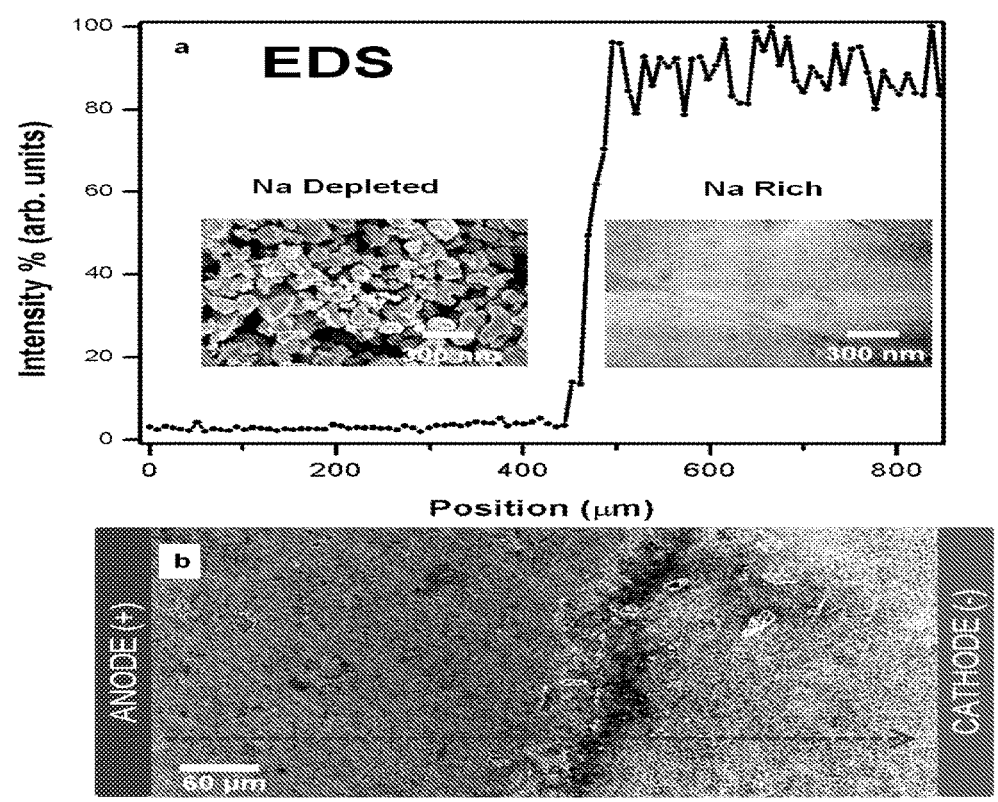
FIG. 4a shows an energy dispersive x-ray spectrum (EDS) of the sodium depleted and the sodium rich portions of an electro-kinetically demixed Na—Co—O nanosheet material compositions whose x-ray powder diffraction spectra are illustrated in FIG. 3.
FIG. 4b shows a scanning electron microscopy image of the sodium depleted and the sodium rich portions of the electro-kinetically demixed Na—Co—O material compositions whose x-ray powder diffraction spectra are illustrated in FIG. 3.

While not being bound to a particular theory of operation of the embodiments, the kinetic demixing may be considered to create a Na saturated compound, which increases the Co diffusion coefficient, leading to the millimeter-length single crystal nanosheet material compositions. As illustrated in FIG. 4, elemental analysis from a scanning electron microscopy-energy dispersive x-ray spectroscopy (SEM-EDS) line scan shows an abrupt transition in Na content and morphology between the sample region adjacent to the cathode (negative terminal) and that to the anode. As illustrated within the FIG. 4a inset images, the region near the anode is extremely porous and Na-depleted, while the material near the cathode has a smooth unbroken surface, is Na-rich, and is composed of several sodium, cobalt and oxygen containing compounds as illustrated in FIG. 3. As is illustrated within an EDS line scan in FIG. 4a, separating these regions is a sharp step border in Na content, characteristic of kinetic demixing where an initially homogenous solution decomposes into separate phases. Cross-section SEM images (FIG. 4a) and XRD data (FIG. 3) show that the anode region is a highly porous network of nano-dimensional $Co_3O_4$ particles. Correlating EDS data with sample volume suggest that the Na:Co ratio is as high as 1.3 in the Na-rich side, ~2× higher than the most thermodynamically stable phase of $Na_xCoO_2$. Assuming the dominant diffusion mechanism is cation vacancy diffusion, this over-saturation of Na increases the bulk diffusion constant of Co ions due to physical correlation with highly mobile Na ions, as previously observed for other metal oxide solid solutions. While not limiting the embodiments, it is anticipated that this amplification of the Co diffusion coefficient results in cooperative effects which lead to nanosheet formation including but not limited to: (1) facile grain growth; (2) fluidity in the pellet during calcinations; and (3) enhancement of the anisotropic growth along the (001) plane (favored due to the high difference in surface energies between the (001) plane and the planes perpendicular to (001) which originates from the highly different bond energies along corresponding directions).

III. Physical Measurement of the Single Crystal $Na_xCoO_2$ Nanosheet Material Compositions in Accordance with the Embodiments As is illustrated in FIG. 3, θ-2θ XRD of the crushed powders after calcination indicates trigonal $Na_{0.9}CoO_2$ as the dominant phase, which can be transformed to the hexagonal $Na_{0.7}CoO_2$ phase after a secondary heat treatment at a temperature of about 850 degrees Celsius for a time period of about 40 hours. The transition from x=0.9 to 0.7 appears to have no effect on nanosheet thickness and length. θ-2θ XRD scans of the millimeter-long nanosheets aligned parallel to the sample stage show only the 00L and 104 peaks, while other diffraction peaks are absent (see, e.g., FIG. 5a), indicating that the nanosheets are large crystals which are strongly oriented.

Figure 5:
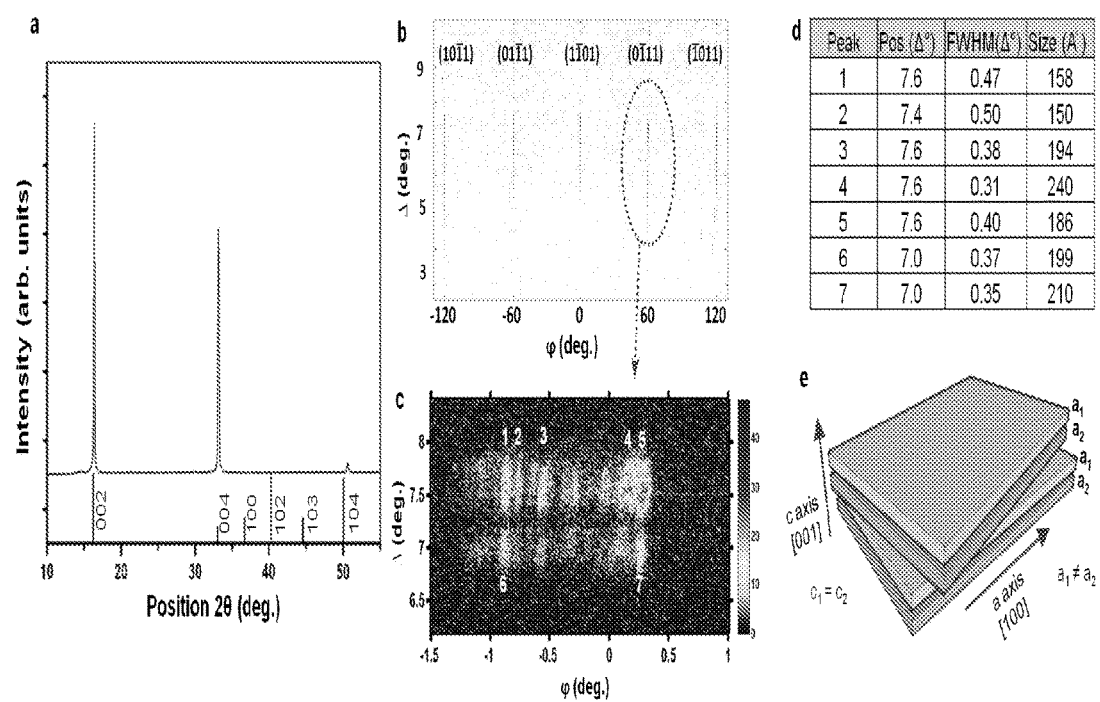
FIG. 5a shows a $\theta$-$2\theta$ x-ray diffraction spectrum of a single crystal $Na_xCoO_2$ nanosheet material composition in accordance with the embodiments.
FIG. 5b and FIG. 5c show grazing incident angle x-ray diffraction spectral characteristics of a single crystal $Na_xCoO_2$ nanosheet material composition in accordance with the embodiments.
FIG. 5d shows a chart of finite sizes calculated using Scherrer's equation for the seven spots in the grazing incident angle x-ray diffraction spectral characteristics of FIG. 5c.
FIG. 5e shows a sketch of a hypothetical ordering of single crystal $Na_xCoO_2$ nanosheet material compositions in accordance with available x-ray diffraction data.
Figure 6:
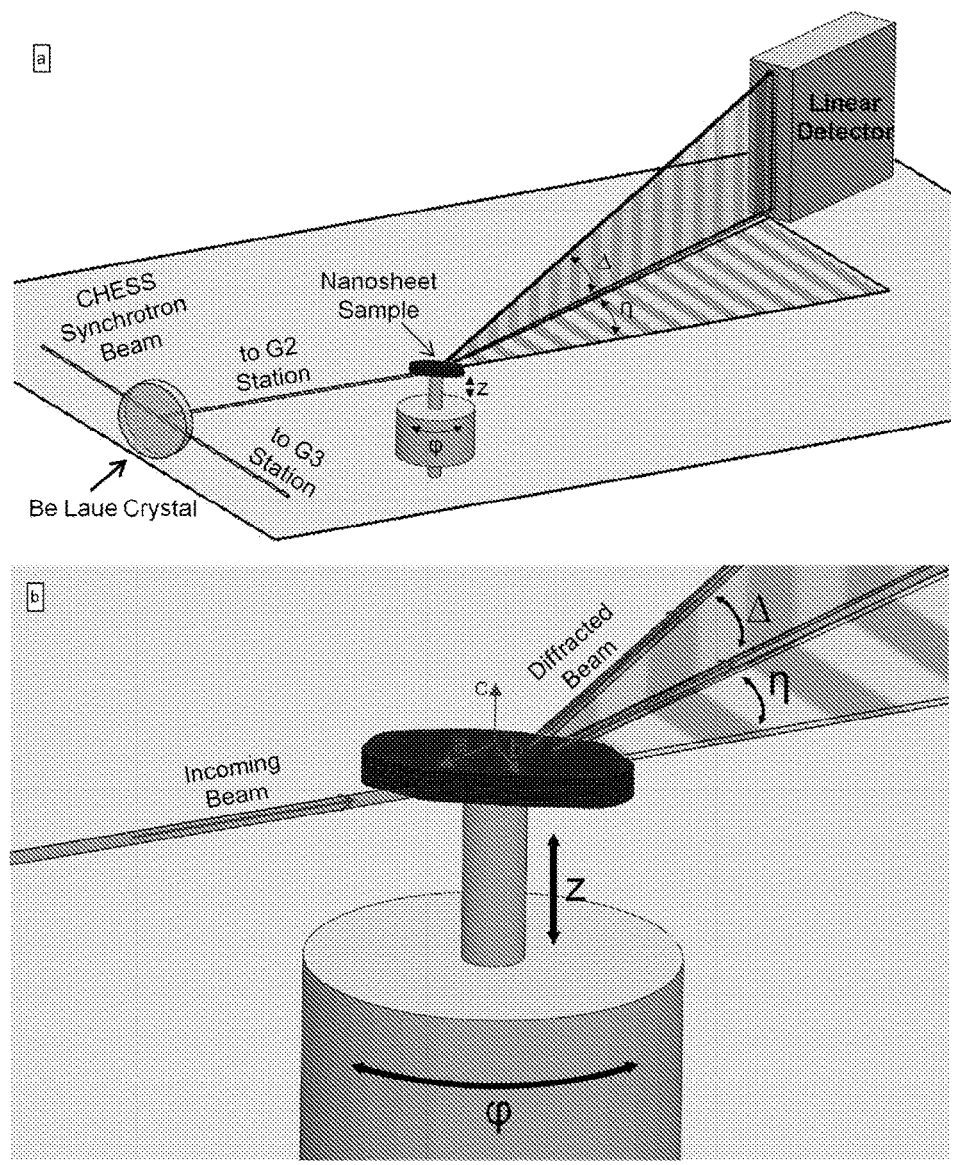
FIG. 6a and FIG. 6b show schematic diagrams illustrating a grazing incident angle x-ray diffraction experimental configuration in accordance with the embodiments.

Conventional θ-2θ XRD scans of the nanosheets show no finite size broadening of the 00L peaks (see, e.g., FIG. 5a). In-plane XRD analysis at the Cornell High Energy Synchrotron Source, a schematic diagram of which is illustrated in FIG. 6, provides a more accurate description of the nanosheet crystals and finite-size effects. Results show the crystal symmetry is consistent with $Na_{0.7}CoO_2$ and indicates broadening associated with the nanosheet thickness, as illustrated in FIG. 5b and FIG. 5c. Peaks at ~7.5° from the horizontal (Δ) and separated by 60° along the in-plane φ axis correspond to the sixfold symmetry of the (101) planes of $Na_{0.7}CoO_2$ (see, e.g., FIG. 5b). Higher resolution scans of these peaks from several samples show ~4-12 diffraction spots within ~1° along the φ axis. FIG. 5c shows the case with ~12 diffraction spots. Because the φ scan represents a rocking curve for (100) planes, these spots are the result of rotational misalignment (~0.1° with respect to each other) of the ~12 distinct crystals around [001]. Finite-size broadening effects can be determined by examining the (101) diffraction. Since the Δ and φ axes are orthogonal in both real and reciprocal space, and Δ projects onto the vertical linear detector which is parallel to [001], vertical broadening of the 101 peak corresponds to finite size effects along the [001] direction, as illustrated in FIG. 7c. According to Scherrer analysis, as illustrated in FIG. 5d, the broadening along Δ gives an average nanosheet thickness of 19.1 nm, which is in good agreement with statistical analysis performed by SEM (18.2 nm, in accordance with FIG. 8). Because broadening is observed in the high-resolution 2D scan, but not in conventional θ-2θ XRD of (001) planes, the nanosheets are stacked in registry along [001] and the finite size broadening observed in the (101) peak is from the nanometer-thickness of the nanosheets, which is made evident in this mode of diffraction due to a turbostratic arrangement of the nanosheets (planes rotated around the c-axis, see FIG. 7b). This is substantiated by the rotational misalignment of the ~12 grains, as illustrated in FIG. 5c.

The two distinct diffraction spots observed along Δ indicate there are two different (100) lattice spacings. A hypothetical 3D sketch of the possible nanosheet stacking configuration is provided in FIG. 5e. It is important to note that no broadening was observed for either of the two (100) d-spacings, which confirms that the finite size along [001] solely originates from the nanosheet thickness.

Figure 9:
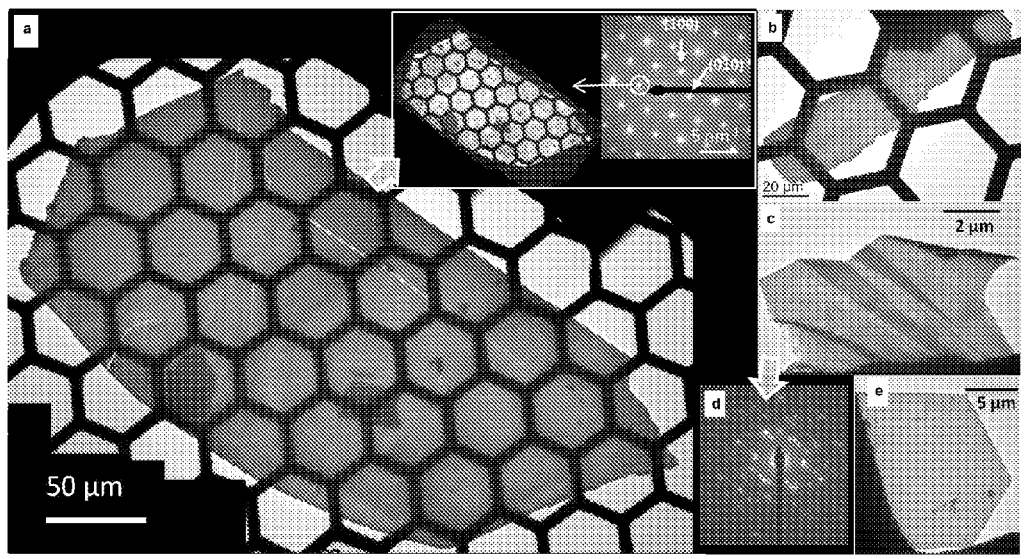
FIG. 9a shows a transmission electron microscopy image of a 350 μm×150 μm×100 μm exfoliated single crystal $Na_xCoO_2$ nanosheet material composition in accordance with the embodiments. In the top right inset figure of FIG. 9a, a dark field image and an electron diffraction pattern of the same single crystal $Na_xCoO_2$ nanosheet material composition are shown.
FIG. 9b shows a transmission electron microscopy image of a 120 μm×20 μm×100 μm exfoliated single crystal $Na_xCoO_2$ nanosheet material composition in accordance with the embodiments.
FIG. 9c shows a transmission electron microscopy image of a folded exfoliated single crystal $Na_xCoO_2$ nanosheet material composition in accordance with the embodiments.
FIG. 9d shows an electron diffraction pattern corresponding with the folded single crystal $Na_xCoO_2$ nanosheet material composition whose transmission electron microscopy image is illustrated in FIG. 9c.
FIG. 9e shows a transmission electron microscopy image of a micron sized exfoliated single crystal $Na_xCoO_2$ nanosheet material composition with hexagonal growth morphology matching a unit cell.
Figure 10:
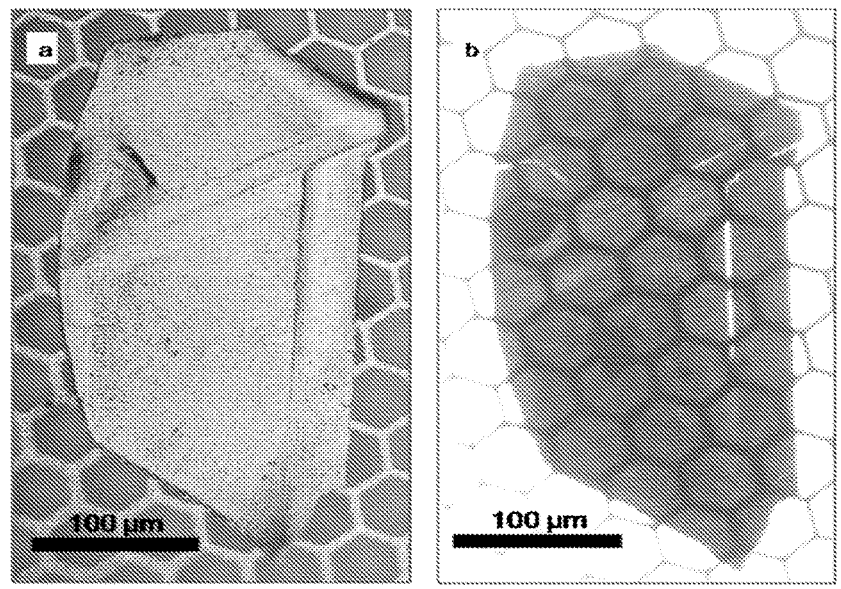
FIG. 10a and FIG. 10b show optical microscopy images of a comparatively large exfoliated single crystal $Na_xCoO_2$ nanosheet material composition in accordance with the embodiments with respect to reflected (FIG. 10a) white light and transmitted (FIG. 10b) white light.
Figure 11:
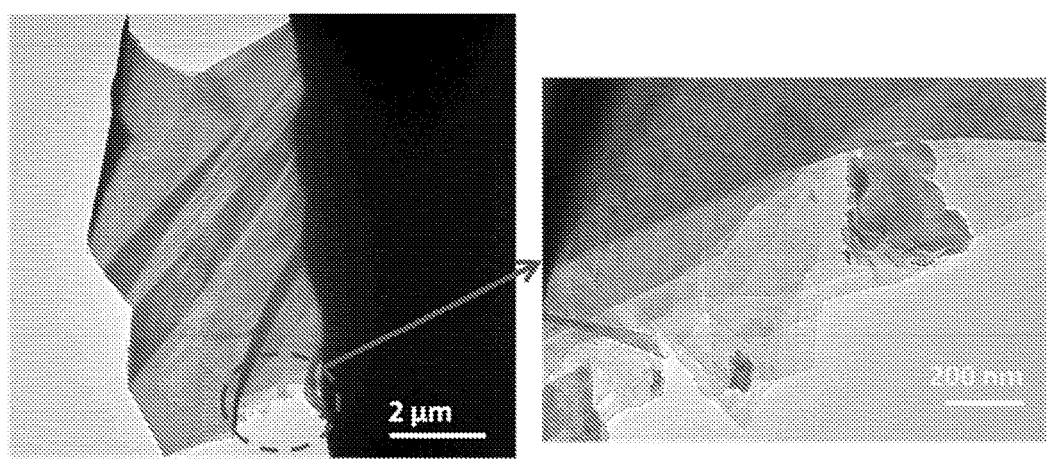
FIG. 11 shows transmission electron microscopy images illustrating single layers on an edge of an exfoliated single crystal $Na_xCoO_2$ nanosheet material composition in accordance with the embodiments.

Free-standing exfoliated nanosheets are typically 10-350 microns wide as characterized using transmission electron microscopy and optical microscopy, as illustrated in FIG. 9 and FIG. 10. It is anticipated that this marks over an order of magnitude improvement in the maximum lateral lengths of typical single crystal metal-oxide nano sheets. The exfoliated nanosheets are estimated to be between 20-100 nm thick based on layer counting at the sample edges (see, e.g., FIG. 11). Selected area electron diffraction (SAED) from multiple regions of each nanosheet confirm the hexagonal crystal symmetry and lattice spacing of $Na_{0.7}CoO_2$, and with a [001] zone axis. The well defined points in SAED, as illustrated in FIG. 9a, confirm that the stacked nanosheets are in registry with one another along the c-direction. TEM dark-field analysis from a hexagonal-lattice {100} diffraction spot shows the entire sheet illuminated for the exfoliated nanosheets, proving that the entire sheet is a single crystal, as illustrated in FIG. 9a, inset. In reflected white light (i.e., FIG. 10a) the nanosheets appear opaque and black, consistent with bulk samples of $Na_{0.7}CoO_2$. However, under transmitted light they range from a translucent yellow to red (i.e., as shown by a different shading within FIG. 10b). This discovery yields a facile method to distinguish between thin, electron transparent, layers and bulk pieces of $Na_{0.7}CoO_2$. Cross polarized transmitted light shows the nanosheets to be optically isotropic, as is expected when viewing a hexagonal crystal along [001].

In conclusion, the more specific embodiments provide a novel synthesis for production of millimeter length single crystal nanosheets of $Na_xCoO_2$. A nanomanufacturing method in accordance with the embodiments is scalable and low-cost, and produces tens of thousands of nanosheets for device integration. The nanosheets are readily exfoliated into free-standing nanosheets with dimensions up to at least about 350 microns and thicknesses from about 5 to about 100 nanometers.

Figure 12:
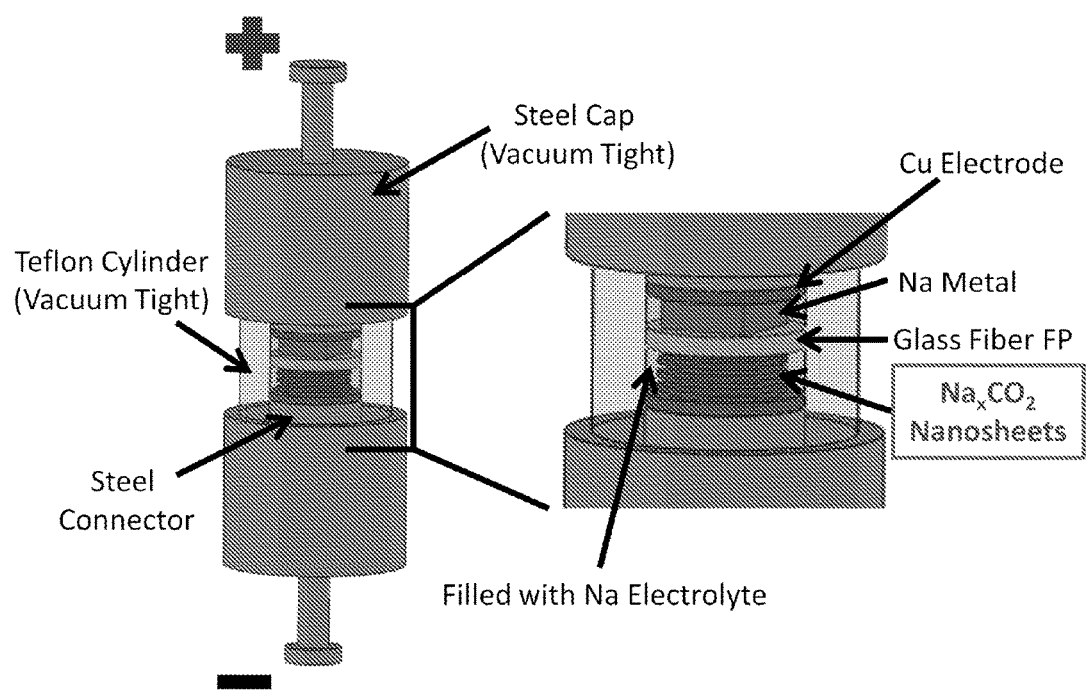
FIG. 12 shows a schematic diagram of a battery apparatus that may be made using the single crystal mixed metal oxide nanosheet material composition in accordance with the embodiments.

IV. Applications for Conductive Single Crystal Mixed Metal Oxide Nanosheet Material Compositions in Accordance with the Embodiments In accordance with disclosure above, the embodiments contemplate that single crystal mixed metal oxide nanosheet material compositions may be used within battery electrodes within several types of batteries, including but not limited to sodium ion batteries. A particular sodium battery construction is illustrated in FIG. 12.

Figure 13:
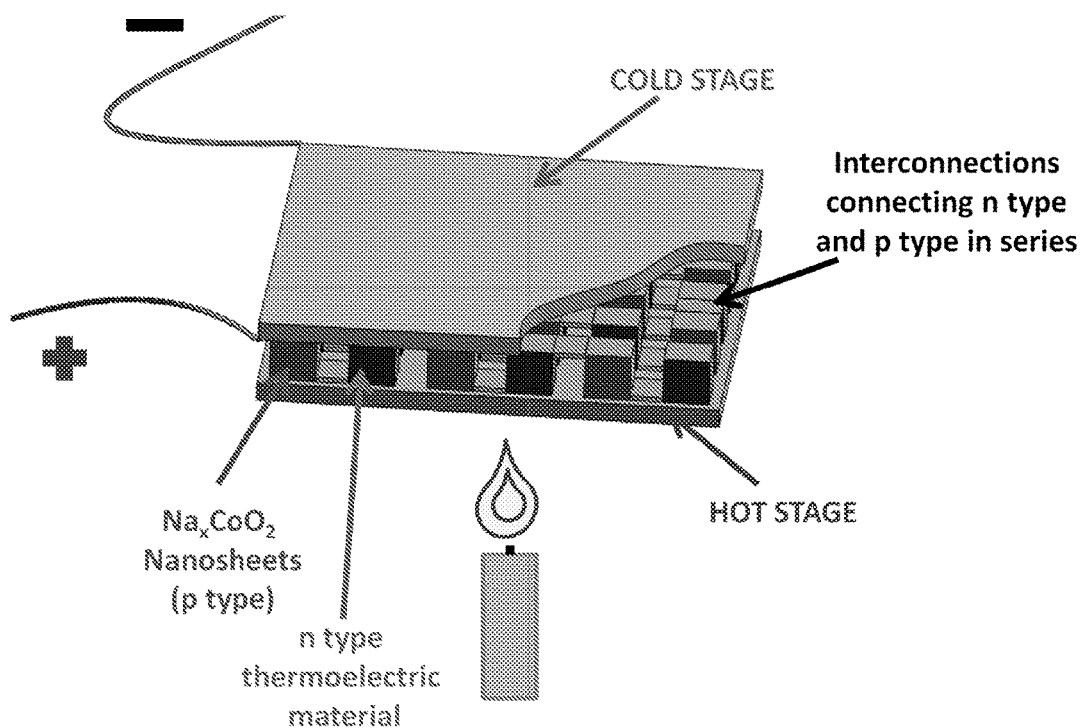
FIG. 13 shows a schematic diagram of a thermoelectric apparatus that may include a single crystal mixed metal oxide nanosheet material composition as a thermal to electrical energy conversion element in accordance with the embodiments.

As well, the embodiments also contemplate that single crystal mixed metal oxide nanosheet material compositions in accordance with the embodiments may be used within thermoelectric devices, such as but not limited to thermoelectric generator devices. A particular schematic diagrammatic representation of such a thermoelectric generator thermoelectric device is illustrated within the schematic diagram of FIG. 13. FIG. 13 shows $Na_{0.7}CoO_2$ nanosheet material compositions in accordance with the embodiments as p-type materials that are assembled in conjunction with an n-type thermoelectric material (i.e., which may include, but is not necessarily limited to $Sr_{0.9}Y_{0.1}TiO_3$ n-type material).

The embodiments also contemplate that single crystal mixed metal oxide nanosheet material compositions may be used within electronic displays (i.e., which may include, but are not necessarily limited to liquid crystal diode (LCD), light emitting diode (LED) and plasma displays) as conductive, bendable and transparent layers for the sake of improving the flexibility of electronic displays.

The embodiments also contemplate that single crystal mixed metal oxide nanosheet material compositions, in general, may be used as an electrically conductive and ductile construction material. Due to its ductility, it is expected that a single crystal mixed metal oxide nanosheet material composition in accordance with the embodiments will be relatively easy to mechanically process and due to its high temperature resistance. It is also expected that mixed metal oxide nanosheet material will be suitable for constructing items for high temperature applications.

The embodiments also contemplate that single crystal mixed metal oxide nanosheet material compositions, in general, may be used as electrically conductive supports for electro-catalytic applications. Such single crystal mixed metal oxide nanosheet material compositions can be preferable as supports for electro-catalytic applications due to their high electrical conductivity and high chemical stability.

The embodiments also contemplate that single crystal mixed metal oxide nanosheet material compositions may be used within lighting devices as light emitting units. Under high electrical current, such single crystal mixed metal oxide nanosheet material compositions may be expected to emit light with high luminous efficacy in the visible light regime due their transparency. Such single crystal mixed metal oxide nanosheet material compositions may also be expected to have a long life time as high temperature light emitting materials due to their resistance to high temperatures.

V. Experimental

1. Synthesis of Single Crystal $Na_{0.7}CoO_2$ Nanosheet Material Composition:

An aqueous solution was prepared at room temperature by mixing appropriate quantities of poly(acrylic acid) (PAA), cobalt (II) nitrate hexahydrate (0.230 M) and sodium nitrate (0.165 M) in deionized water. The Na to Co ratio was set to 0.72. The amount of PAA (average molecular weight: Mw ~1800) was 1:2, metal ions to the number of carboxylate groups. The solution was stirred and evaporated at 150° C. on a hotplate until it reached 20% of the initial volume. The resulting dark red solution was then auto-combusted at 500° C. The resulting black powder was uniaxially pressed into pellets with a rectangular die set at 400 MPa. A typical size of the pellet was 10×6×5 mm (L×W×T). The pellet was kinetically demixed at 300° C. with a constant-current electrical field of 500 mA through Cu plates and contacts made of silver epoxy. A representative schematic diagram of such a kinetic demixing apparatus is illustrated in FIG. 1. Over the course of 48 hours the voltage fluctuated between 20 V and 5 V, decreasing near the end of the process. During the kinetic demixing process, a red emitting current pathway appears on the pellet surface with temporally changing position. After the kinetic demixing, the boundary between Na-rich and Na-depleted regions was clearly distinguishable. The Na-depleted region was mechanically weak, porous and grey while the Na-rich region was mechanically strong, dense and black. The Na rich region of the pellet was separated and calcined in a tube furnace to finally obtain $Na_xCoO_2$ nanosheets. The furnace rapidly heated to 1040° C. and held for 15 minutes, ramped down to 1000° C. in 1.5 hours, and then to room temperature in 3 hours. Thinner nanosheets may be obtained from heating at 1060° C. as the initial temperature. After calcination $Na_{0.7}CoO_2$ phases have a high Na content (0.8<x<0.93). To obtain the thermoelectric phase $Na_{0.7}CoO_2$. The sample was subjected to a secondary heat treatment at 850° C. for ~40 hours.

2. Exfoliation of the Single Crystal $Na_{0.7}CoO_2$ Nanosheet Material Composition in Accordance with the Embodiments Exfoliation of the single crystal $Na_{0.7}CoO_2$ nanosheet material composition was accomplished though thermal shock and ultrasonication. Pellets of stacked $Na_xCoO_2$ nanosheets were repeatedly quenched from 500° C. in clean (18 Mohm), room temperature water, followed by a brief sonication in water. The nanosheets were then collected from the water surface.

3. XRD, SEM, EDS and TEM Characterization of the Single Crystal $Na_{0.7}CoO_2$ Nanosheet Material Composition in Accordance with the Embodiments All of the intermediate and final products of the synthesis procedure were examined by a high resolution (~1 nm at 2 keV) SEM (scanning electron microscope; LEO 1550 FESEM) and by XRD. At least 100 nanosheets were measured by SEM for statistical analysis of nanosheet thicknesses. SEM-EDS performed compositional analysis. Conventional 2θ-θ XRD measurements were obtained using a Scintag (Pad-X) apparatus equipped with a Cu Kα1 source. For phase analysis the samples were finely ground before the measurement in order to minimize possible texturing and crystal alignment effects. The peak locations were identical to unground samples. For Scherrer broadening analysis the samples were not ground. TEM images, electron diffraction, and dark field imaging were performed with an FEI T12 Twin TEM apparatus.

Figure 7:
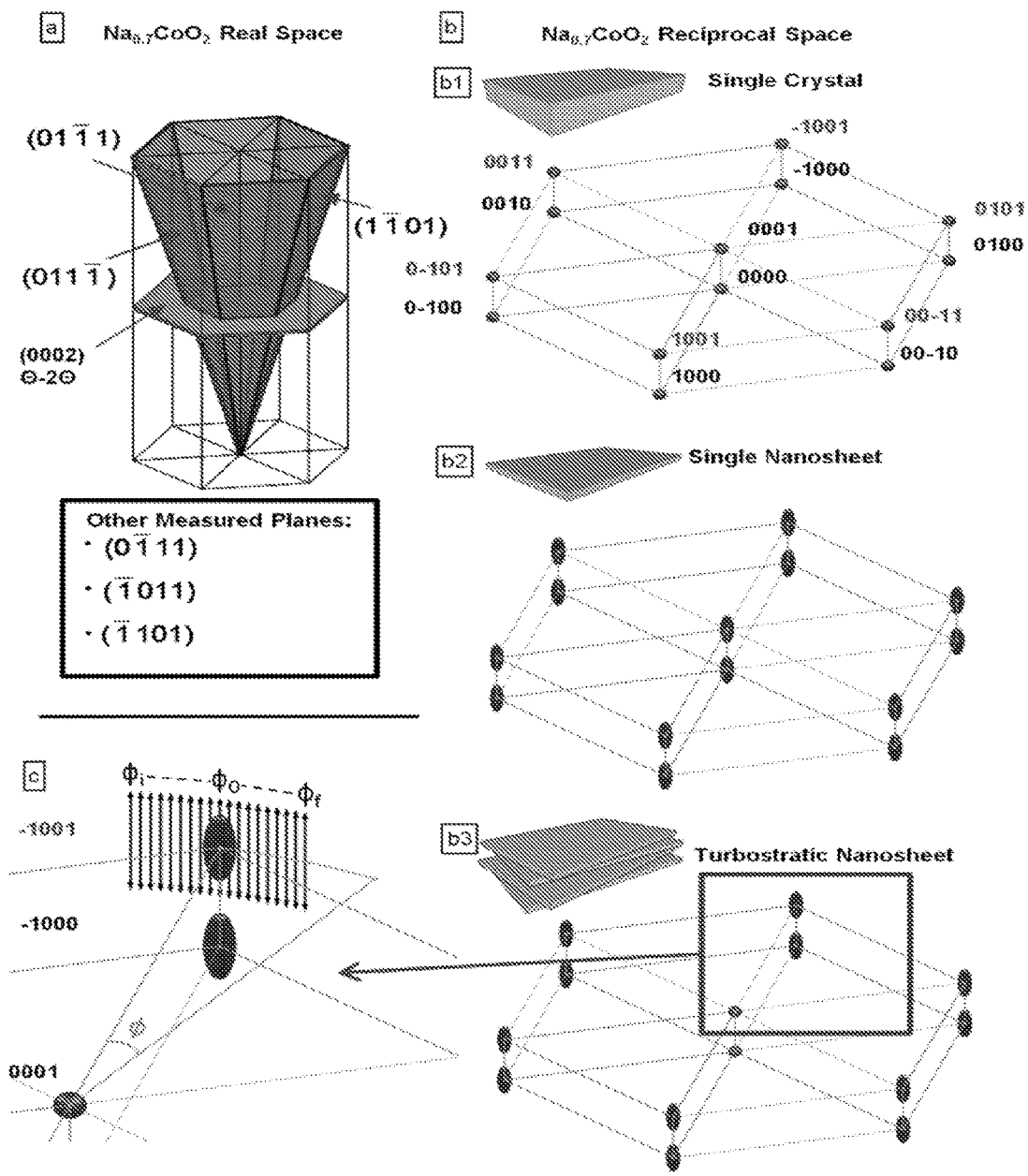
FIG. 7a and FIG. 7b show, respectively, real and reciprocal space representations of the single crystal $Na_xCoO_2$ nanosheet material composition in accordance with the embodiments.
FIG. 7c shows a schematic diagram of a grazing angle scan of a single crystal $Na_xCoO_2$ nanosheet material composition in accordance with the embodiments in progress.
Figure 8:
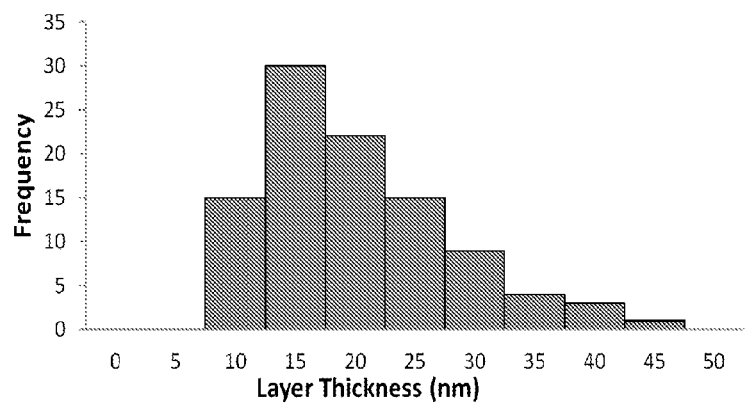
FIG. 8 shows a histogram of thickness of 100 layers of a single crystal $Na_xCoO_2$ nanosheet material composition as measured using a scanning electron microscopy method.

4. Synchrotron X-Ray Analysis of the Single Crystal $Na_{0.7}CoO_2$ Nanosheet Material Composition in Accordance with the Embodiments The 6-axis diffractometer at the Cornell High Energy Synchrotron Source (CHESS) provides an effective means to characterize layered structures since it allows for different types of 2D scans in reciprocal space which can be arranged to obtain reciprocal lattice mapping characteristics, rocking curve characteristics, and combinations of these two characteristics. The nanosheets are oriented with their [001] axis aligned vertically and the incident beam skims the horizontal plane (~0.05). A linear detector (represented by Δ axis in angular space) is fixed to a position defined with respect to the Bragg condition of {101} planes of $Na_{0.7}CoO_2$ and aligned parallel to [001]. During the measurement, the sample was rotated about [001] (φ rotational axis). This simultaneously provides a rocking curve type scan for (100) planes due to the φ rotation and a θ-2θ type of scan for (001) planes due to the linear range of the detector. FIG. 6 and FIG. 7 show a detailed description for these characteristics.

All references, including publications, patent applications, and patents cited herein are hereby incorporated by reference in their entireties to the extent allowed, and as if each reference was individually and specifically indicated to be incorporated by reference and was set forth in its entirety herein.

The use of the terms "a," "an" and "the" and similar referents in the context of describing the embodiments or the invention (especially in the context of the following claims) is to be construed to cover both the singular and the plural, unless otherwise indicated herein or clearly contradicted by context. The terms "comprising," "having," "including" and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein is merely intended to serve as a shorthand method of referring individually to each separate value falling within the range, unless otherwise indicated herein, and each separate value is incorporated into the specification as if it was individually recited herein.

All methods described herein may be performed in any suitable order unless otherwise indicated herein or otherwise clearly contradicted by context. The use of any and all examples, or exemplary language (e.g., "such as") provided herein, is intended merely to better illuminate embodiments and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A nanosheet comprising a single crystal mixed metal oxide $M1_xM2_yO_2$ material composition where:
   M1 is an alkali metal or alkali earth metal;
   M2 is a transition or post-transition metal of atomic number not greater than 78; and
   x and y are independently variable within the ranges $0.3<x<1$ and $0.9<y<1.1$, where the nanosheet has:
      in-plane mutually perpendicular lateral sheet dimensions greater than 10 microns by 200 microns; and
      a thickness from 5 to 100 nanometers.

2. The nanosheet of claim 1 wherein:
   M1 is at least one alkali metal or alkali earth metal selected from the group consisting of Li, Na, K, Be, Mg, Ca and Sr; and
   M2 is at least one transition metal selected from the group consisting of Ti, V, Cr, Mn, Fe, Co, Zn and Ni.

3. The nanosheet of claim 1 wherein:
   M1 is at least one alkali metal or alkali earth metal selected from the group consisting of Li, K, Be, Mg, Ca and Sr; and
   M2 is at least one transition metal selected from the group consisting of Ti, V, Cr, Mn, Fe, Co, Zn and Ni.

4. The nanosheet of claim 1 wherein the nanosheet has in-plane mutually perpendicular lateral sheet dimensions greater than 200 microns by 350 microns.

5. The nanosheet of claim 1 wherein the nanosheet has a lateral dimension greater than 1.8 millimeter.

6. The nanosheet of claim 1 wherein the nanosheet has a lateral dimension greater than 4.0 millimeter.

7. The nanosheet of claim 1 wherein the nanosheet consists essentially of the single crystal mixed metal oxide $M1_xM2_yO_2$ material composition absent a substrate.

8. The nanosheet of claim 1 wherein the nanosheet has a thickness from about 7.5 to about 47.5 nanometers.

9. The nanosheet of claim 1 wherein the nanosheet has a thickness from about 5 to about 20 nanometers.

10. A nanosheet comprising a single crystal $Na_xCoO_2$ material composition where $0.6<x<0.9$, and having:
    in-plane mutually perpendicular lateral sheet dimensions greater than 10 microns by 200 microns; and
    a thickness from 5 to 100 nanometers.

11. The nanosheet of claim 10 wherein the nanosheet has in-plane mutually perpendicular lateral sheet dimensions greater than 200 microns by 350 microns.

12. The nanosheet of claim 10 wherein the nanosheet has a lateral dimension greater than 1.8 millimeter.

13. The nanosheet of claim 10 wherein the nanosheet has a lateral dimension greater than 4.0 millimeter.

14. The nanosheet of claim 10 wherein the nanosheet consists essentially of the single crystal $Na_xCoO_2$ material composition absent a substrate.

15. The nanosheet of claim 10 wherein the nanosheet has a thickness from about 7.5 to about 47.5 nanometers.

16. The nanosheet of claim 10 wherein the nanosheet has a thickness from about 5 to about 20 nanometers.

17. A battery electrode including a nanosheet comprising a single crystal $Na_xCoO_2$ material composition where $0.6<x<0.9$, and having:
    in-plane mutually perpendicular lateral sheet dimensions greater than 10 microns by 200 microns; and
    a thickness from 5 to 100 nanometers.

18. A thermoelectric device including a nanosheet comprising a single crystal $Na_xCoO_2$ material composition where $0.6<x<0.9$, and having:
    in-plane mutually perpendicular lateral sheet dimensions greater than 10 microns by 200 microns; and
    a thickness from 5 to 100 nanometers.

19. A method for preparing a nanosheet comprising:
    electrokinetically demixing a pressed mixed metal oxide powder comprising an M1 alkali metal or alkali earth metal and an M2 transition or post-transition metal of atomic number not greater than 78 to provide an M1 alkali metal or alkali earth metal enriched mixed metal oxide powder portion and an M1 alkali metal or alkali earth metal deficient mixed metal oxide powder portion; and
    calcining the M1 alkali metal or alkali earth metal enriched mixed metal oxide powder portion to provide the nanosheet comprising a single crystal mixed metal oxide $M1_xM2_yO_2$ material composition wherein the single crystal mixed metal oxide $M1_xM2_yO_2$ material composition has:
       x and y independently variable within the ranges $0.3<x<1$ and $0.9<y<1.1$;
       in-plane mutually perpendicular lateral sheet dimensions greater than 10 microns by 200 microns; and
       a thickness from 5 to 100 nanometers.

20. The method of claim 19 wherein the method comprises a bulk fabrication method.

21. The method of claim 19 wherein the nanosheet has a thickness from about 7.5 to about 47.5 nanometers.

22. The method of claim 19 wherein the nanosheet has a thickness from about 5 to about 20 nanometers.

23. A method for preparing a nanosheet comprising:
    auto-combusting an M1 alkali metal or alkali earth metal and M2 transition or post-transition metal chelated composition to provide a mixed metal oxide powder;
    anisotropically pressing the mixed metal oxide powder to provide a pressed rectangular mixed metal oxide powder pellet;
    electrokinetically demixing the pressed mixed metal oxide powder to provide an M1 alkali metal or alkali earth metal enriched mixed metal oxide powder portion and an M1 alkali metal or alkali earth metal deficient mixed metal oxide powder portion; and
    calcining the M1 alkali metal or alkali earth metal enriched mixed metal oxide powder portion to provide the nanosheet comprising a single crystal mixed metal oxide $M1_xM2_yO_2$ material composition wherein the single crystal mixed metal oxide $M1_xM2_yO_2$ material composition nanosheet has:
       x and y independently variable within the ranges $0.3<x<1$ and $0.9<y<1.1$;
       in-plane mutually perpendicular lateral sheet dimensions greater than 10 microns by 200 microns; and
       a thickness from 5 to 100 nanometers.

24. The method of claim 23 wherein the method comprises a bulk fabrication method.

25. The method of claim 23 wherein the nanosheet has a thickness from about 7.5 to about 47.5 nanometers.

26. The method of claim 23 wherein the nanosheet has a thickness from about 5 to about 20 nanometers.

27. A method for preparing a nanosheet comprising:
    electrokinetically demixing a pressed Na—Co—O powder to provide a sodium enriched Na—Co—O powder portion and a sodium deficient Na—Co—O powder portion; and
    calcining the sodium enriched Na—Co—O powder portion to provide a nanosheet comprising a single crystal $Na_xCoO_2$ material composition wherein the single crystal $Na_xCoO_2$ material composition nanosheet has:

x variable within the range 0.6<x<0.9;
in-plane mutually perpendicular lateral sheet dimensions greater than 10 microns by 200 microns; and
a thickness from 5 to 100 nanometers.

28. The method of claim 27 wherein the method comprises a bulk fabrication method.

29. The method of claim 27 wherein the nanosheet has a thickness from about 7.5 to about 47.5 nanometers.

30. The method of claim 27 wherein the nanosheet has a thickness from about 5 to about 20 nanometers.

31. A method for preparing a nanosheet comprising:
auto-combusting a sodium-cobalt chelated composition to provide a Na—Co—O powder;
anisotropically pressing the Na—Co—O powder to provide a pressed Na—Co—O powder;
electrokinetically demixing the pressed Na—Co—O powder to provide a sodium enriched Na—Co—O powder portion and a sodium deficient Na—Co—O powder portion; and
calcining the sodium enriched Na—Co—O powder portion to provide a nanosheet comprising a single crystal $Na_xCoO_2$ material composition wherein the single crystal $Na_xCoO_2$ material composition nanosheet has:
x variable within the range 0.6<x<0.9;
in-plane mutually perpendicular lateral sheet dimensions greater than 10 microns by 200 microns; and
a thickness from 5 to 100 nanometers.

32. The method of claim 31 wherein:
the auto-combusting is undertaken at a temperature from 250 to 550 degrees centigrade;
the anisotropically pressing is undertaken at a temperature from 18 to 30 degrees Celsius and a pressure from 200 to 600 MPa;
the electrokinetically demixing is undertaken at a temperature from −100 to 800 degrees Celsius and a current 0.5 amps; and
the calcining is undertaken at a temperature from 650 to 1300 degrees Celsius.

33. The method of claim 31 wherein the method comprises a bulk fabrication method.

34. The method of claim 31 wherein the nanosheet has a thickness from about 7.5 to about 47.5 nanometers.

35. The method of claim 31 wherein the nanosheet has a thickness from about 5 to about 20 nanometers.

* * * * *